(12) United States Patent
Aono et al.

(10) Patent No.: US 9,872,380 B2
(45) Date of Patent: Jan. 16, 2018

(54) CERAMIC CIRCUIT BOARD AND METHOD FOR PRODUCING SAME

(71) Applicant: Denka Company Limited, Chuo-ku, Tokyo (JP)

(72) Inventors: Ryota Aono, Omuta (JP); Akimasa Yuasa, Omuta (JP); Takeshi Miyakawa, Omuta (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 15/327,159

(22) PCT Filed: Jul. 29, 2015

(86) PCT No.: PCT/JP2015/071477
§ 371 (c)(1),
(2) Date: Jan. 18, 2017

(87) PCT Pub. No.: WO2016/017679
PCT Pub. Date: Feb. 4, 2016

(65) Prior Publication Data
US 2017/0181272 A1    Jun. 22, 2017

(30) Foreign Application Priority Data

Jul. 29, 2014  (JP) ................................. 2014-153504

(51) Int. Cl.
| | |
|---|---|
| *H05K 1/03* | (2006.01) |
| *H05K 3/00* | (2006.01) |
| *H05K 1/02* | (2006.01) |
| *C04B 37/02* | (2006.01) |
| *C09K 5/14* | (2006.01) |
| *B23K 1/00* | (2006.01) |
| *H05K 3/46* | (2006.01) |
| *B23K 35/30* | (2006.01) |
| *B23K 35/02* | (2006.01) |

(52) U.S. Cl.
CPC ......... *H05K 1/0271* (2013.01); *B23K 1/0016* (2013.01); *C04B 37/026* (2013.01); *C09K 5/14* (2013.01); *H05K 1/0204* (2013.01); *H05K 1/0306* (2013.01); *H05K 3/4611* (2013.01); *B23K 35/0244* (2013.01); *B23K 35/3006* (2013.01); *C04B 2237/125* (2013.01); *C04B 2237/366* (2013.01); *C04B 2237/407* (2013.01); *C04B 2237/74* (2013.01); *H05K 2201/068* (2013.01)

(58) Field of Classification Search
CPC ........................... H05K 1/0306; H05K 3/0061
See application file for complete search history.

(56) References Cited

U.S. PATENT DOCUMENTS

2015/0282379 A1* 10/2015 Terasaki .............. H01L 23/3735
361/720

FOREIGN PATENT DOCUMENTS

| JP | 2000-340912 A | 12/2000 |
|---|---|---|
| JP | 2002-164461 A | 6/2002 |
| JP | 2006-282417 A | 10/2006 |
| JP | 2007-066995 A | 3/2007 |
| JP | 2013-089865 A | 5/2013 |
| JP | 2014-090144 A | 5/2014 |

* cited by examiner

Primary Examiner — Jeremy C Norris
(74) Attorney, Agent, or Firm — Foley & Lardner LLP

(57) ABSTRACT

[Problem] To obtain a ceramic circuit board having superior crack-resistance with respect to ultrasonic bonding.

[Solution] The abovementioned problem is solved by a ceramic circuit board characterized in that a metal circuit board is bonded to one surface of a ceramic substrate and a metal heat radiation plate is bonded to the other surface of the ceramic substrate, wherein the crystal grain size in the metal circuit board is at least 20 μm and at most 70 μm. This ceramic circuit board can be manufactured by arranging the metal circuit board on one surface of the ceramic substrate and arranging the metal heat radiation plate on the other surface of the ceramic substrate, and bonding in a vacuum of at most $1\times10^{-3}$ Pa, at a bonding temperature of at least 780° C. and at most 850° C., for a retention time of at least 10 minutes and at most 60 minutes.

4 Claims, No Drawings

CERAMIC CIRCUIT BOARD AND METHOD FOR PRODUCING SAME

CROSS-REFERENCE TO RELATED APPLICATIONS

This application is a National Stage application of PCT/JP2015/071477, filed Jul. 29, 2015, which claims priority from Japanese application JP 2014-153504, filed Jul. 29, 2014.

TECHNICAL FIELD

The present invention relates to a ceramic circuit board and a manufacturing method for same.

BACKGROUND ART

Power modules aimed at railways, vehicles, and industrial machinery that require high voltage and large current operation are provided with ceramic circuit boards having semiconductor elements bonded thereon. To facilitate output from ceramic circuit boards to the exterior, it is common to provide copper electrodes such as to protrude to the outside of ceramic circuit boards.

Traditionally, solder is used to bond ceramic circuit boards and copper electrodes, but there is the problem that the heat and vibrations generated when they are used as power modules cause solder to crack, lowering reliability. Consequently, it has become common to use ultrasonic bonding to directly bond metal circuit boards and copper electrodes. Ultrasonic bonding is a technique for integrating the copper plates and copper electrodes of circuit boards by applying ultrasonic vibrations in the lateral direction while copper electrodes impart a vertical load on ceramic circuit boards.

Aluminum nitride sintered bodies and silicon nitride sintered bodies having high thermal conductivity are being used as the ceramic substrates employed in ceramic circuit boards in response to the increases in the amount of heat generated that accompany the increasing output and integration of semiconductor elements. In particular, as aluminum nitride substrates have higher thermal conductivity compared with silicon nitride substrates, they are suitable as ceramic circuit boards for mounting electronic components with high heat radiation.

However, the converse of aluminum nitride substrates having high thermal conductivity is that they have low mechanical strength, toughness, etc., so there is the problem of cracks forming in the aluminum nitride board surfaces immediately below the portions bonded via vibration during ultrasonic bonding, resulting in the loss of module reliability. In response to this, the following solution was proposed in order to prevent the generation of cracks in ceramic substrates.

Patent Document 1 provides a way to prevent the occurrence of cracks in ceramic substrates by optimizing the positions at which copper electrodes are bonded using ultrasonic bonding and the joint strength between the copper electrodes and metal circuit boards.

Patent Document 1 JP 2002-164461 A

SUMMARY OF THE INVENTION

However, Patent Document 1 does not improve ceramic circuit boards themselves and does not arrive at a fundamental solution for preventing the occurrence of cracks.

In view of the abovementioned problem, the objective of the present invention is to obtain ceramic circuit boards having superior crack-resistance with respect to ultrasonic bonding.

As a result of earnest investigation, the inventors of the present invention discovered that the crack-resistance during ultrasonic bonding can be improved by making the crystal grain size of a metal circuit board in a ceramic circuit board small.

In short, the present invention is directed to a ceramic circuit board wherein a metal circuit board is bonded to one surface thereof and a metal heat radiation plate is bonded to the other surface thereof, wherein the crystal particle size of the metal circuit board is at least 20 µm and at most 70 µm.

Further, the present invention is directed to a manufacturing method for the above ceramic circuit board, comprising arranging a metal circuit board on one surface of a ceramic substrate and arranging a metal heat radiation plate on the other surface of the ceramic substrate, and bonding the metal circuit board and the metal heat radiation plate to the ceramic substrate in a vacuum of at most $1\times10^{-3}$ Pa, at a bonding temperature of at least 780° C. and at most 850° C., for a retention time of at least 10 minutes and at most 60 minutes.

Due to the present invention, it is possible to obtain a ceramic circuit board having superior crack-resistance with respect to ultrasonic bonding.

MODES FOR CARRYING OUT THE INVENTION (Ceramic Circuit Board)

The ceramic circuit board according to the present invention is characterized in that a metal circuit board is bonded to one surface thereof and a metal heat radiation plate is bonded to the other surface thereof, wherein the crystal particle size in the metal circuit board after bonding is at least 20 µm and at most 70 µm.

Crack-resistance during ultrasonic bonding can be improved by setting the crystal grain size in the metal circuit board after bonding to at least 20 µm and at most 70 µm. The crystal grain size in the metal circuit board is, preferably, at least 20 µm and at most 65 µm and more preferably, at least 20 µm and at most 62 µm.

There are no specific limitations as to the ceramic substrate used in the ceramic circuit board of the present invention and nitride-based ceramics such as silicon nitride and aluminum nitride, oxide-based ceramics such as aluminum oxide and zirconium oxide, carbide-based ceramics such as silicon carbide, and boride-based ceramics such as lanthanum boride can be used. However, as the metal plate is bonded to the ceramic substrate via active metal soldering, non-oxide-based ceramics such as aluminum nitride and silicon nitride are preferable and furthermore, from the viewpoint of superior thermal conductivity, aluminum nitride substrates are preferable.

While there are no particular limitations as to the thickness of the ceramic substrate, a thickness of at least 0.2 mm and at most 1.5 mm is preferable. Setting the thickness to at most 1.5 mm prevents increases in the thermal resistance and setting the thickness to at least 0.2 mm allows for durability to be maintained.

There are no particular limitations as to the metal used in the metal circuit board and the metal heat radiation plate as long as they are metals to which active metal soldering can be applied, such as copper, aluminum, iron, nickel, chromium, silver, molybdenum, or cobalt as elementary substances or alloys thereof, but from the viewpoint of conductivity and heat radiation, copper plates are preferable. The metal circuit board and the metal heat radiation plate may be composed of the same metal or of different metals.

It is preferable that the purity of the copper plate be at least 90%. By setting the purity to at least 90%, insufficient reaction between the copper plate and the brazing filler metal and lowered reliability of the circuit board due to hardening of the copper plate can be prevented when bonding the copper plate to the ceramic substrate.

There are no particular limitations as to the thickness of the copper plate, but it is standard for the thickness to be at least 0.1 mm and at most 1.5 mm. In particular, from the viewpoint of heat radiation, a thickness of at least 0.2 mm is preferable and from the viewpoint of heat cycle resistance characteristics, a thickness of at most 0.5 mm is preferable.

There are no particular limitations as to the type of copper plate, such as rolled copper foil or electrolytic copper foil, but in order to make the crystallized grain size small after bonding with the ceramic substrate, electrolytic copper foil is more preferable. Further, electrolytic copper foil may be used on the circuit side of the ceramic substrate and rolled copper foil may be used on the radiation surface side. In addition, in cases in which rolled copper foil is used on the circuit surface side, it is possible to achieve smaller sizes via optimization of the temperature conditions such as heating speed and cooling speed during bonding.

Bonding between the metal circuit and metal radiation plates used in the present invention and the ceramic substrate is performed via brazing filler metal layers. As such, the ceramic substrate has a structure in which a metal heat radiation plate, a brazing filler metal layer, a ceramic substrate, a brazing filler metal layer, and a metal circuit board are layered in this order. The brazing filler metal layers include Ag, Cu, or an Ag—Cu alloy and active metal components such as Ti, Zr, or Hf.

The content ratio of active metal components such as Ti, Zr, and Hf contained in the brazing filler metal layers is at least 0.5 parts by mass, preferably at least 2.0 parts by mass and at most 10 parts by mass, preferably at most 6.0 parts by mass with respect to the total of 100 parts by mass of the Ag, Cu, or Ag—Cu alloy.

Further, in another embodiment of the present invention, the ceramic circuit board may be a ceramic circuit board characterized in that a metal circuit is bonded on one surface of a ceramic substrate and a metal heat radiation plate is bonded on the other surface of the ceramic substrate, wherein bonding is performed in a vacuum of at most $1 \times 10^{-3}$ Pa, at a temperature of 780-850° C., for a retention time of 10 to 60 minutes, and the crystallization grain size in the metal circuit board after bonding is smaller than 100 μm.

In yet another embodiment, the ceramic circuit board may be a ceramic circuit board characterized in that a metal circuit is bonded on one surface thereof and a metal heat radiation plate is bonded on the other surface thereof via Ag—Cu alloy brazing filler metal layers, wherein bonding is performed with the vacuum during bonding being at most $1 \times 10^{-3}$ Pa, the bonding temperature being 780-850° C., and the retention time being 10 to 60 minutes, wherein the crystallization grain size in the metal circuit board after bonding is smaller than 100 μm, and wherein the ceramic substrate comprises aluminum nitride.

(Manufacturing Method)

Ceramic substrates can be manufactured by arranging, on one surface of a ceramic substrate, a metal plate for forming metal circuits, and arranging, on the other surface of the ceramic substrate, a metal plate for forming a heat radiation plate, and bonding the metal circuit board and the metal heat radiation plate to the ceramic substrate in a vacuum of at most $1 \times 10^{-3}$ Pa, at a bonding temperature of at least 780° C. and at most 850° C., for a retention time of at least 10 minutes and at most 60 minutes.

It is preferable that the bonding temperature for the ceramic circuit board is at least 780° C. and at most 850° C. in a vacuum furnace with a vacuum of at most $1 \times 10^{-3}$ Pa and desirable that the retention time is at least 10 minutes and at most 60 minutes. By setting the bonding temperature to at least 780° C. and the retention time to at least 10 minutes, problems such as portions not being able to bond due to not being possible for sufficient Ti compounds to be generated can be avoided. By setting the bonding temperature to at most 850° C. and the retention time to at most 60 minutes, problems that can arise when the temperature is high and the retention time is too long such as increases in thermal stress originating from differences in thermal expansion coefficients during bonding can be suppressed, and the reduction of heat cycle resistance characteristics can be prevented.

Bonding between the metal circuit and metal heat radiation plates and the ceramic substrate used in the present invention can be performed via active metal brazing using a brazing filler metal. Brazing filler metal that includes Ag, Cu, or an Ag—Cu alloy and active metal components such as Ti, Zr, and Hf can be used. For example, it is possible to use an alloy foil that includes an active metal such as Ag, Cu, or Ti or to use pastes in which elementary metal or alloy powders thereof are dispersed in a binder such as polyisobutene methacrylate and terpineol or the like. Adjusted pastes are applied to the front and back surfaces of the ceramic substrate by such methods as screen printing and roll coating and the metal plate for forming metal circuits is arranged on the front surface and the metal plate for forming a radiation plate is arranged on the back surface.

To form circuit patterns on the bonded ceramic circuit board, etching resist is applied to the metal plate and etching is performed. There are no particular limitations relating to the etching resist, for example, generally used ultraviolet curable types and thermosetting types may be employed. There are no particular limitations relating to the application method for the etching resist, for example, widely known application methods such as screen printing may be adopted.

An etching process is performed on the copper plate to from a circuit pattern. There are no particular limitations as to the etching solution and generally employed solutions such as ferric chloride solution, cupric chloride solution, sulfuric acid, or hydrogen peroxide solution may be used, but ferric chloride solution and cupric chloride solution are preferable. In nitride ceramic circuit boards from which unnecessary metal portions have been removed via etching, the applied brazing filler metal, alloy layers thereof, nitride layers, etc. remain and are generally removed via the use of solutions that include aqueous ammonium halide solutions, inorganic acids such as sulfuric acid or nitric acid, or hydrogen peroxide solution. The removal method for removing etching resist following circuit formation is not particularly limited and methods such as immersion in an aqueous alkali solution are standard.

EXAMPLES

Example 1

An active metal brazing filler metal containing 3.5 parts by mass of titanium (TSH-350 manufactured by Osaka Titanium Technologies) with respect to 90 parts by mass of silver powder (AgC-BO manufactured by Fukuda Metal Foil & Powder Co., Ltd.) and 10 parts by mass of copper powder (SRC-Cu-20 manufactured by Fukuda Metal Foil & Powder Co., Ltd.) coming to a total of 100 parts by mass, was applied to both surfaces of a 0.635 mm thick aluminum nitride substrate. Following this, a bonded body of copper plates and an aluminum nitride substrate was manufactured by stacking a copper plate for forming circuits and a copper plate for forming a heat radiation plate (both of which were composed of electrolytic copper foil), respectively, on the front surface and the rear surface of the aluminum nitride substrate and holding them at a temperature of 800° C. for 20 minutes in a vacuum atmosphere ($6.5 \times 10^{-4}$ Pa).

Circuits were formed by etching the bonded circuit board with an etching solution comprising copper chloride. Further, the brazing filler metal layers were etched with an ammonium fluoride/hydrogen peroxide etching solution and an aluminum nitride circuit board was manufactured.

Measurements of the crystal grain size in the metal circuit board of the obtained aluminum nitride circuit board, ultrasonic bonding test, and heat-cycle test were performed as follows.

<Crystal Grain Size>

The front surface of the metal circuit board of the ceramic circuit board was observed using an optical microscope (50×). The longest crystal distance in 10 random 1 mm×1 mm regions was confirmed and the average was calculated to arrive at the crystal grain size. The results are shown in Table 1.

<Ultrasonic Bonding Test>

Bonding was performed with a 1.5 mm thick copper electrode material (UP-Lite 3000 manufactured by Adwelds), with a load of 1200 N, a frequency of 20 kHz, an amplitude of 50 μm, and a bonding time of 0.4 seconds. After bonding, the copper electrode and copper circuit board were removed by etching and the front surface of the ceramic substrate was observed with an optical microscope. Ultrasonic bonding was performed at 16 locations for each condition and the locations where cracks occurred were ranked in the following three categories.
A: 0 locations, B: 1-8 locations, and C: 9-16 locations <Heat Cyde Test>

The manufactured ceramic circuit board was exposed to thermal shock testing and after 500 thermal shock testing cycles in which one cycle is 30 minutes at −40° C. and 30 minutes at 125° C., the copper plates were removed by etching and the condition regarding the occurrence of cracks in the front surface of the ceramic substrate was observed with an optical microscope (50×). Heat cycle testing was performed on 10 plates and these were ranked in the following three categories by the largest crack length value of the measured crack lengths.
A: No cracks were observed.
B: Observed cracks were less than 100 μm in length.
C: Observed cracks were 100 μm or longer in length.

Considering each evaluation, a comprehensive ranking by the following three ranks was performed.
Good: Plates with an A rank in both the ultrasonic bonding test and heat cycle test.
Fair: Plates with a B rank in either the ultrasonic bonding test or the heat cycle test.
Poor: Plates with a C rank in either the ultrasonic bonding test or the heat cycle test.

Examples 2-5 and Comparative Examples 1-5

In cases other than the changes in conditions indicated in Table 1, testing and evaluation was performed as in Example 1.

TABLE 1

| | Metal Plate | Bonding Temperature ° C. | Bonding Retention Time Minutes | Crystallization Grain Size in the Metal Circuit Board after Bonding μm | Evaluation (Crack Occurrence) | | Judgment |
|---|---|---|---|---|---|---|---|
| | | | | | Ultrasonic Bonding | Heat Cycle Resistance | |
| Example 1 | Electrolytic Copper Foil | 810 | 20 | 31 | A | A | Good |
| Example 2 | Electrolytic Copper Foil | 790 | 20 | 22 | A | A | Good |
| Example 3 | Electrolytic Copper Foil | 840 | 20 | 55 | A | A | Good |
| Example 4 | Electrolytic Copper Foil | 810 | 10 | 20 | A | A | Good |
| Example 5 | Electrolytic Copper Foil | 810 | 50 | 62 | A | A | Good |
| Comparative Example 1 | Electrolytic Copper Foil | 770 | 20 | 18 | No Bond | No Bond | — |
| Comparative Example 2 | Electrolytic Copper Foil | 865 | 20 | 81 | A | B | Fair |
| Comparative Example 3 | Electrolytic Copper Foil | 810 | 5 | 15 | No Bond | No Bond | — |
| Comparative Example 4 | Electrolytic Copper Foil | 810 | 90 | 91 | A | B | Fair |
| Comparative Example 5 | Electrolytic Copper Foil | 950 | 20 | 172 | B | C | Poor |

As shown above, due to the present invention, when bonding copper electrodes to a ceramic circuit board by ultrasonic bonding, bonding can be performed without cracks occurring in the ceramic substrate, ceramic circuit boards that are capable of improving module reliability are provided.

The invention claimed is:

1. A ceramic circuit board comprising a metal circuit board bonded to one surface of a ceramic substrate and a metal heat radiation plate bonded to the other surface of the ceramic substrate, wherein a crystal grain size in the metal circuit board is at least 20 μm and at most 70 μm.

2. The ceramic circuit board according to claim 1, wherein the ceramic substrate comprises aluminum nitride.

3. A manufacturing method for the ceramic circuit board according to claim 1, comprising arranging a metal circuit board on one surface of a ceramic substrate and arranging a metal heat radiation plate on the other surface of the ceramic substrate, and bonding the metal circuit board and the metal heat radiation plate to the ceramic substrate in a vacuum of at most $1\times10^{-3}$ Pa, at a bonding temperature of at least 780° C. and at most 850° C., for a retention time of at least 10 minutes and at most 60 minutes.

4. A manufacturing method for the ceramic circuit board according to claim 2, comprising arranging a metal circuit board on one surface of a ceramic substrate and arranging a metal heat radiation plate on the other surface of the ceramic substrate, and bonding the metal circuit board and the metal heat radiation plate to the ceramic substrate in a vacuum of at most $1\times10^{-3}$ Pa, at a bonding temperature of at least 780° C. and at most 850° C., for a retention time of at least 10 minutes and at most 60 minutes.

\* \* \* \* \*